United States Patent
Maguire et al.

(10) Patent No.: US 7,560,927 B2
(45) Date of Patent: Jul. 14, 2009

(54) SLITTED AND STUBBED MICROSTRIPS FOR HIGH SENSITIVITY, NEAR-FIELD ELECTROMAGNETIC DETECTION OF SMALL SAMPLES AND FIELDS

(75) Inventors: Yael Maguire, Cambridge, MA (US); Neil Gershenfeld, Somerville, MA (US); Issac L. Chuang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/927,808

(22) Filed: Aug. 27, 2004

(65) Prior Publication Data

US 2005/0122115 A1    Jun. 9, 2005

Related U.S. Application Data

(60) Provisional application No. 60/498,711, filed on Aug. 28, 2003.

(51) Int. Cl.
*G01V 3/00* (2006.01)
*H01P 7/06* (2006.01)
*H01Q 1/00* (2006.01)

(52) U.S. Cl. ................ 324/318; 333/227; 343/905
(58) Field of Classification Search ......... 324/300–322; 600/410–435; 333/219–235; 343/723, 741, 343/771, 824, 904, 905
See application file for complete search history.

(56) References Cited

U.S. PATENT DOCUMENTS 4,783,641 A * 11/1988 Hayes et al. ............... 333/219
4,983,936 A * 1/1991 Murakami et al. .......... 333/202
5,185,573 A * 2/1993 Larson, III ................. 324/309
5,530,424 A * 6/1996 Harrison et al. ............ 340/500
5,903,198 A * 5/1999 Weiss ....................... 333/24.1
6,184,836 B1 * 2/2001 Ali .............................. 343/702
6,771,070 B2 * 8/2004 Lee ............................. 324/318
7,023,209 B2 * 4/2006 Zhang et al. ................ 324/318
7,095,767 B1 * 8/2006 Thornton et al. ........ 372/45.01

OTHER PUBLICATIONS

Active Antenna; http://www.mrw.interscience.wiley.com/eeee/01/1201/W.1201-2.html.*
Microwave Circuits; http://www.mrw.interscience.wiley.com/eeee/25/4925/W.4925-1.html.*
Xiaoliang Zhang et al.; "Microstrip RF Surface Coil Design for Extremely High-Field MRI and Spectroscopy", 2001, MAgnetic Resonance in Medicine, 46, pp. 443-450.*
Julian Codreanu et al.; "Influence of dielectric substrate on the responsivity of microstrip dipole-antenna-coupled infrared microbolometers"; Optical Society of America; Apr. 1, 2002; vol. 41, No. 10; pp. 1835-1840.*

* cited by examiner

*Primary Examiner*—Dixomara Vargas (57) ABSTRACT

An electromagnetic field sensor or generator employing a radio frequency microstrip transmission channel formed by a low-loss dielectric substrate sandwiched between a non-resonant microstrip conductor and a conductive ground plane. A discontinuity in said microstrip conductor that substantially alters its cross-sectional dimensions causes electrical signals in the microstrip conductor to be inductively coupled to near field electromagnetic radiation in the vicinity of the discontinuity. The discontinuity may be defined by one or more holes, slots, slits or stubs in the microstrip. The sensor/generator may be used in numerous applications, including NMR spectrometry, as a near field scanning device to inspect operating integrated circuits, or to read or write data on magnetic materials.

20 Claims, 4 Drawing Sheets

SLITTED AND STUBBED MICROSTRIPS FOR HIGH SENSITIVITY, NEAR-FIELD ELECTROMAGNETIC DETECTION OF SMALL SAMPLES AND FIELDS

CROSS REFERENCE TO RELATED APPLICATIONS

This application is a non-provisional of, and claims the benefit of the filing date of, U.S. Provisional Patent Application Ser. No. 60/498,711 filed on Aug. 28, 2003, the disclosure of which is incorporated herein by reference.

FIELD OF THE INVENTION

This invention relates to methods and apparatus for generating and detecting electromagnetic fields and to applications which utilize such methods and apparatus.

BACKGROUND OF THE INVENTION

There is a significant need for better ways to detect, analyze and manipulate biological macromolecules which include DNA and proteins which are the fundamental the building blocks of nature. Improved devices and methods for working with biological macromolecules would have profound consequences on our fundamental understanding of biology, biomedical technologies and nano/micro/macroscopic engineering.

A tremendous body of work over the last several decades has created a growing database of structural information on proteins and nucleic acids. Unfortunately, available techniques for gathering information on individual structures are unpredictable, error prone, and extremely time consuming. Nuclear Magnetic Resonance (NMR) techniques give indirect structural results of macro-molecules in solution, but when used with conventional spectrometers, NMR techniques require milligrams of high concentration samples. For many applications, the preparation of these quantities of molecules is impractical.

The ability to quickly and accurately obtain such structural information is enormously important. In medicine, no adequate analytical tools currently exist for examining the proteins of our bodies to give advanced warnings of disease. For many diseases such as Alzheimer's which are caused by protein dysfunction, early detection could save lives by allowing doctors to start drug or other therapies even before physiological or mental deficiencies appear. It would be tremendously useful to have a benchtop-size tool for this task to add to the analytical arsenal in hospitals around the world.

As we learn to engineer biomolecules, we will need tools that allow us to characterize molecules, not only for structure but also for kinetics and dynamics. Nuclear Magnetic Resonance (NMR) can be used to measure kinetics and dynamics, but its poor sensitivity prevents NMR from being used to perform many needed functions. A new type of detector capable of sensing tiny magnetic fields is accordingly needed. Such a detector must provide greater sensitivity and the ability to analyze samples that are several orders of magnitude smaller than the sample sizes currently required. The availability of such a detector would decrease the time needed to get structural information by several orders of magnitude, and would vastly increase the rate at which structural information can be acquired, making numerous new applications feasible.

There is a further need for detecting highly focalized electric or magnetic RF/microwave field which exist in other environments. For example, as integrated circuits continue to shrink, and become three dimensional, using probe stations to probe points in operating circuit has become increasingly difficult. A contactless sensor that could detect the highly localized electric or magnetic fields produced at specific locations in operating integrated circuit devices would make it possible to more easily and more accurately evaluate the performance of such devices, speed their development, and provide ways to correct localized defects in devices during the manufacturing process, significantly improving yields.

The ability to generate and detect highly localized fields could also used to write and read data onto magnetic materials. For example, a small field generator could set and evaluate the spin state in a magnetic tunnel junction device, providing memory elements that can switch faster, be more compact, and use less power.

SUMMARY OF THE INVENTION

It is accordingly a general object of the invention to generate and detect highly localized electromagnetic fields.

It is a further object of the invention to provide a low-cost, easily manufactured, and highly reliable electromagnetic field generator and/or detector for producing and detecting very small electromagnetic fields.

In its preferred embodiments, the present invention takes the form of a novel non-resonant electromagnetic field generator/detector which can be varied in size from centimeters down to nanometers. The device may be formed by placing small slot, hole, stub or other discontinuity in a planar waveguide called a "microstrip." When an electromagnetic field propagates along the microstrip, the boundary conditions at the discontinuity create and/or detect a highly localized field in the immediate vicinity of the discontinuity.

The electromagnetic field generator and detector contemplated by the invention may be formed by modifying a structure already in widespread use in the microwave industry, a planar waveguide called the "microstrip." A microstrip is typically a dual layer, metallic, planar waveguide used for transporting radio frequency signals in printed circuit boards, microcircuits and antennas. A low loss dielectric material separates a transmission conductor from the ground plane below. Microstrips can be fabricated using a conventional printed circuit board processes employing optical masks and electro-plating. A microstrip provides a planar, easily manufacturable, non-resonant structure with no parasitics that can be fabricated and operated with widths of 1 cm to less than 1 μm.

This structure may be used to generate and detect the properties of very small material samples. Used as a Nuclear Magnetic Resonance (NMR) detector, the structure improves the mass-limited sensitivity of NMR detection by orders of magnitude over conventional technology. Improving sensitivity in NMR may lead to a dramatic increase in the rate and accessibility of protein structural information accumulation and a host of other applications for fundamental understanding of biology and biomedical applications, and micro/macroscopic engineering. Furthermore, the principles of the invention may be used to construct physically scalable, near-field devices that may be used in a variety of ways, including integrated circuit chip diagnosis, the construction of spintronic devices, the manipulation of very small objects or materials, and the magnetic and electric field imaging of surfaces.

BRIEF DESCRIPTION OF THE DRAWINGS

In the detailed description which follows, frequent reference will be made to the attached drawings, in which.

DETAILED DESCRIPTION

Slotted Microstrips—Overview and Definitions

In the description that follows, the term "microstrip" refers to a single conductor waveguide which, in its most common form, consists of an elongated planar conductive strip that is spaced from a conductive ground plane. Microstrip are widely used as transmission lines in microwave integrated circuits and printed circuits. See Vendelin, G., Pavio, A., and Rohde, U., *Microwave Circuit Design Using Linear and Nonlinear Techniques*, John Wiley, 1990, pg. 37-44.

Microstrips are commonly used in semiconductor devices because they are compatible with conventional fabrication techniques and provide the preferred method of guiding waves over limited distances. The size of the microstrip can be reduced by using a dielectric constant some 2-10 times that of free space (or air). The advantages of microstrips have been well established, and they have been widely used in probes for measuring voltage, current and waves and to interconnect components in microwave integrated circuits.

Microstrips can propagate energy down to zero frequency (direct current) and their construction lends itself to small structures that can carry semiconductor devices and surface-mount lumped elements. The effects of unwanted waveguide modes can be restricted by choosing dielectric thickness less than one quarter wavelength and a strip width less than one-half wavelength at the highest frequency of interest. Such unwanted waveguide modes are accordingly not a problem in the non-resonant structures contemplated by the present invention which are scaled to very small sizes in comparison with the wavelengths used.

The term "slotted microstrip" will be frequently be used in the description that follows to generally designate waveguide conductors that define one or more discontinuities that produce or detect highly localized electromagnetic fields in the immediate vicinity of each discontinuity, and the term "microslot" will be used to refer to the discontinuity in such a waveguide conductor. It should be understood that the discontinuities may assume forms other than "slots," and that a "slotted microstrip" can be formed in many different ways, some of which are illustrated in FIGS. 1-5 below, by incorporating discontinuities of many different kinds, including holes, stubs, slots and slits of varying shapes and forms.

Figure 1:
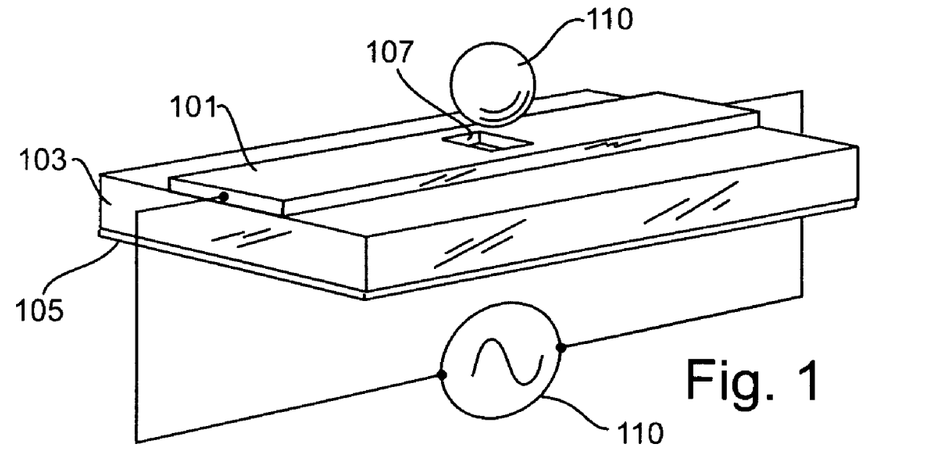
FIG. 1 illustrates a first form of slotted microstrip embodying the invention.

FIG. 1 shows a first embodiment of the invention in which high impedance radio frequency microstrip waveguide transmission channel 101 is supported by a non-conductive printed circuit board substrate 103. The substrate 103 separates the elongated planar single-wire transmission line conductor 101 from a conductive ground plane 105. A small, centrally located aperture is cut out of the microstrip at 107 and the resulting discontinuity in the width of the microstrip produces a pure series inductance that creates a strong, highly-localized, near-field magnetic radiation pattern around the aperture.

Figure 2:
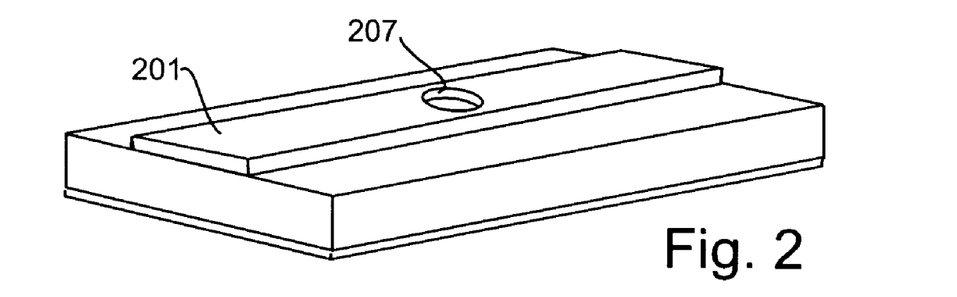
FIG. 2 illustrates a second form of slotted microstrip embodying the invention.
Figure 3:
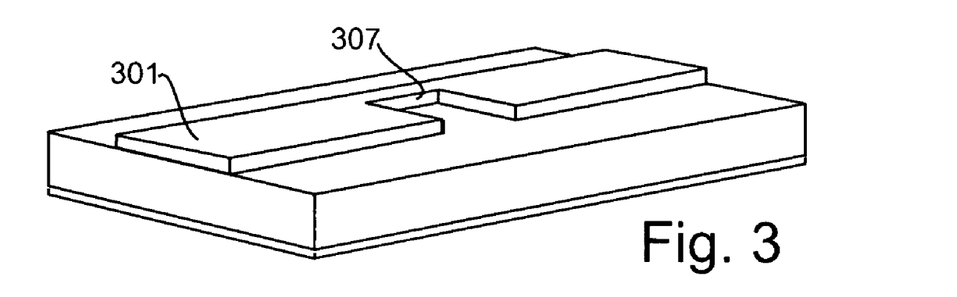
FIG. 3 illustrates a third form of slotted microstrip embodying the invention.
Figure 4:
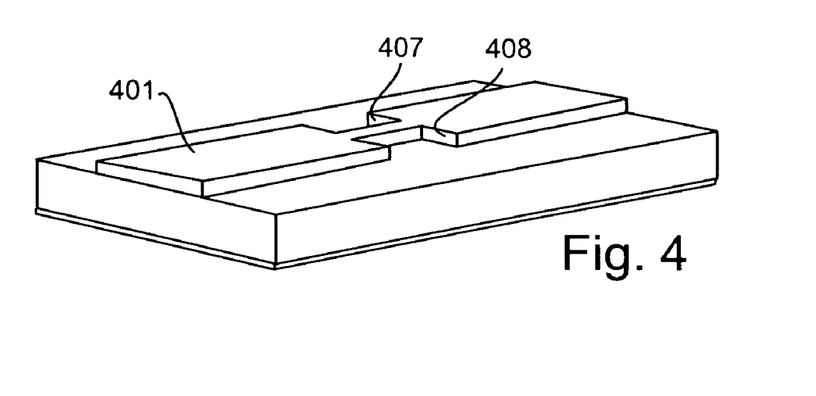
FIG. 4 illustrates a fourth form of slotted microstrip embodying the invention.
Figure 5:
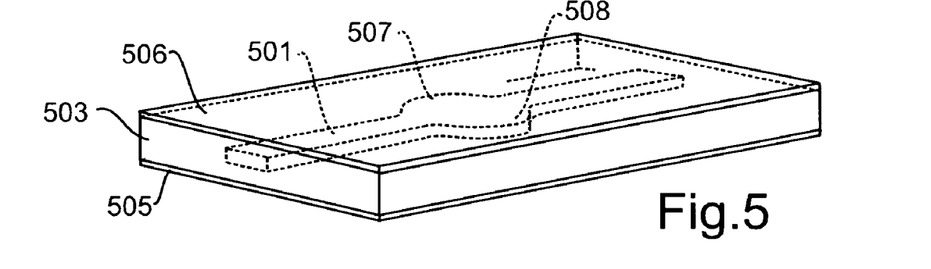
FIG. 5 illustrates a fifth form of slotted microstrip embodying the invention.

As noted above, the "microslot" used to create or detect the highly localized field may take many forms, examples of which are shown in FIGS. 1-5. As seen in FIG. 1, the discontinuity is formed by a rectangular aperture cut into the microstrip at 107 such that the microstrip defines conductive pathways on both sides of the aperture. A similar device is shown in FIG. 2, but differs from the device of FIG. 2 in that the microstrip waveguide channel 201 defines a centrally located circular aperture at 207. The device shown in FIG. 3 consists of a microstrip waveguide 301 in which the discontinuity comprises a non-symmetrical slot 307 cut approximately ¾ of the way through the width of the microstrip from one side. A further illustrative alternative device is shown in FIG. 4 and includes a discontinuity created by a pair of cutout slots 407 and 408 that extend inwardly from opposing side edges of the microstrip, leaving a central conductive pathway between the slots 407 and 408. FIG. 5 shows still another arrangement in which a discontinuity is defined on the microstrip 501 by a pair of outwardly extending stubs seen at 507 and 507 which significantly increase the width of the microstrip at the location of the discontinuity. It may be noted that the slots, slits, holes or stubs which are formed in the microstrip to produce a discontinuity need not be rectangular as shown in FIGS. 1, 2 and 3, but may be curved shapes as illustrated by the circular aperture 207 in FIG. 1 and the curved stubs 507 and 508 seen in FIG. 5.

The elongated single transmission line conductor that forms the waveguide channel is preferably parallel to and spaced from one or more ground plane conductors. As seen in FIG. 1, the transmission line conductor 101 may be positioned at one surface of a non-conductive substrate 103 such as a printed circuit board, and the ground plane 105 may take the form of a conductive layer on the opposing surface of the substrate 103. Similarly, the devices shown in FIGS. 2-4 also employ a planar dielectric substrate that is sandwiched between and supports both the waveguide conductor and an opposing ground plane. Alternative structures may be employed, however, such as the arrangement seen in FIG. 5 in which the transmission line conductor 501 is imbedded in a dielectric material 503 that is sandwiched between two conductive layers 505 and 506 on the opposing surfaces of substrate 503. Although the preferred slotted microstrip structure includes a conductive ground plane which presents an effective surface area that is large in comparison to the width of the transmission line conductor, the conductor spaced from the transmission channel may also be a strip, or the discontinuity may be defined by a single conductor that is spaced far from any other conductor.

A highly localized electromagnetic field is generated in the immediate vicinity of the microslot when a high frequency signal is transmitted down the slotted microstrip. As seen in FIG. 1, an RF signal generator and/or detector 120 may be connected to apply an excitation potential across the length of the transmission line conductor 101 and thereby produce or detect a localized electromagnet field adjacent to the discontinuity formed by the aperture 107. In some applications, the slotted microstrip may be used as both a field generator when excited by a signal source and as a detector which senses the presence and characteristics of the external electromagnetic field in the immediate vicinity of the discontinuity by measuring the potential or current induced in the slotted microstrip by the external field.

The discontinuity introduced in a microstrip acts as a radiative element which can be used to generate and detect highly localized electromagnetic fields. It is known that a narrow slot cut into a microstrip line can be modeled as a pure, small series inductor [see Wolfgang J. R. Hoefer. Equivalent series inductivity of a narrow transverse slit in *Transactions on Microwave Theory and Techniques*, MTT-25(10):822-824, 1977]. A perturbation in the microstrip structure causes the magnetic field component of the quasi-TEM wave to re-orient, while the electric field component of the wave remains largely unaffected. In the near-field, the perturbation of the field can be modeled as a dipole due to the moment expansion of the magnetic vector potential.

The ability to generate and/or detect highly localized electromagnetic fields allows the properties of a sample of very small size to be analyzed. This small sample, illustrated at 110 in FIG. 1, is placed closely adjacent to the discontinuity 107. As discussed in more detail below, the sample 110 may take many forms, depending on the application in which the slotted microstrip is applied, including very small samples of biological macromodules, magnetic memory elements, and a selected region of an operating integrated circuit.

This slotted microstrip structure can be made in widths of 1 cm to less than 1 µm. The slotted microstrip probe can be combined easily into the rest of a conventional probe circuit with no lead impedances. Since the probe is simply a printed circuit board, it can be integrated into a chemical and biological apparatus so that the RF characteristics of the sample itself can be characterized for optimal signal reception.

Scaling

The field strength produced by a coil solenoid can be shown to be inversely proportional to the diameter of the coil. This means that the sensitivity per unit volume of a solenoidal detector is inversely proportional to its diameter. This suggests that an inductive detector should be as small as the sample itself. In other words, to detect small samples, one needs a small detector. Unfortunately, the construction of the solenoid coils small enough to efficiently detect very small objects such as macromolecules is difficult or impossible.

Figure 6:
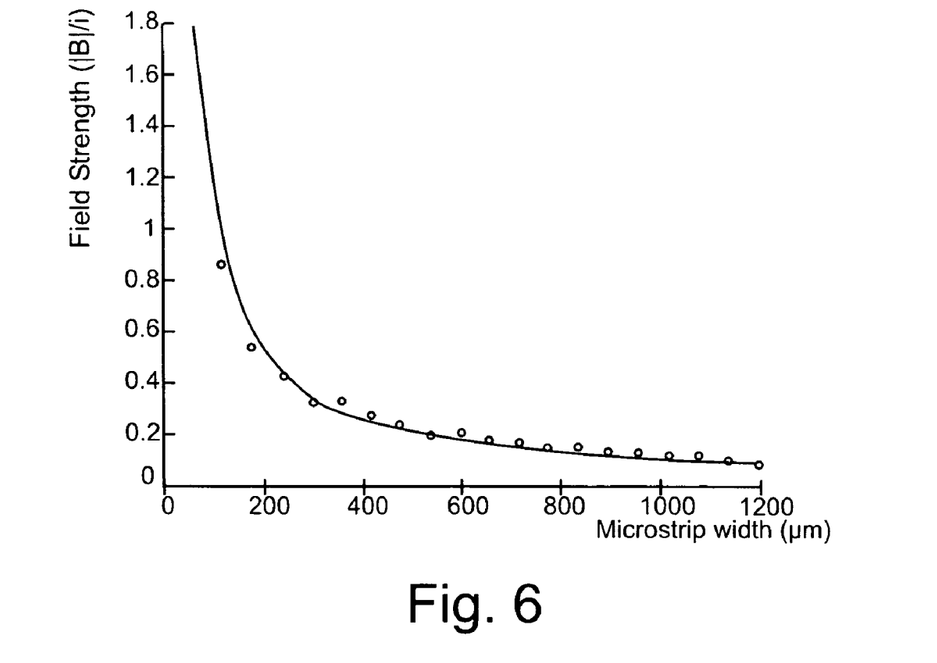
FIG. 6 is a graph plotting the inverse relationship between the width of the slotted microstrip and the field strength produced.

Numerical analysis of the properties of the microslot indicates that it, like the solenoid coil, produces a field whose strength is inversely proportional to the size of the microslot. Using finite element analysis, the relationship between microslot device size r and field strength (|B|/i) is plotted in FIG. 6 from 60 µm to 1200 µm. As demonstrated by this analysis, the field strength produced by the microslot of width r is proportional to 1/r. Thus, the field strength produced by a slotted microstrip, like that of solenoid coil, is inversely proportional to device size. Unlike solenoid coils, however, very small slotted microstrips can be readily fabricated using conventional techniques.

Slotted Microstrip Fabrication

The slotted microstrip provides significant fabrication advantages due to its planar structure. A working slotted microstrip shown in FIG. 7 was constructed using techniques of the kind used in conventional microwave circuit board fabrication. To maximize the quality factor of the microslot, a board substrate 702 was made of Rogers 5880, a glass reinforced Teflon substrate that has one of lowest tangent losses at RF frequencies (=0.0004 at 1 GHz). The dielectric constant was 2.2 at 1 GHz and was approximated to be the same at 500 MHz. The substrate thickness was 3 mm to minimize dielectric losses in the material.

A copper pattern indicated generally at 704 was used to form the slotted microstrip seen at 706 and provide connections to the microstrip. The rectangular aperture 720 formed in the microstrip 706 is shown in the close-up view within the circular area 710 in FIG. 7. Two different copper thicknesses for the microstrip were tested, a 1-ounce and 2-ounce roll laminate (30 and 60 µm respectively). Though it was more difficult to micromachine, the thicker copper was found to be preferable because the larger conduction pathway for the current resulted in lower losses. Slotted microstrips have widths of 297 µm and 6.9 mm were constructed.

Figure 7:
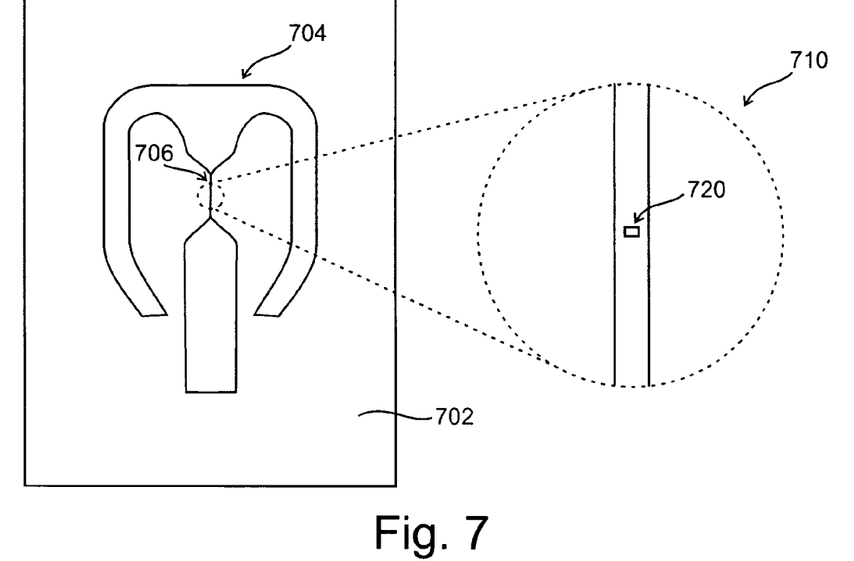
FIG. 7 is a plan view of a printed circuit pattern used to implement a slotted microstrip.

The main pattern 704 for the circuit board was made with traditional fabrication tools, that is, conventional circuit design software and chemical etching by a board fabrication house. The layout is somewhat unconventional but was designed with the goals (1) allowing all components to be on a single side of the circuit board, (2) making the path length to the variable capacitors as short as possible and (3) keeping the capacitors (not shown) away from the center, where magnetic field susceptibility is crucial.

To fabricate the microscopic microslot seen at 720 in the enlargement 710, an excimer laser micromachining center from Resonetics was used. This machine uses mask projection of a 248 nm ultra-violet pulsed laser beam. On the order of 300 mJ per laser pulse can be projected down to a spot size of about 1-5 µm on a side. With a pulse firing rate of up to 200 pulses per second, this large energy per unit area, or fluence, is capable of creating a plasma out of almost any material of interest, including metals.

After laser micromachining the board samples were polished to remove debris remaining from the laser perforation of the microstrip and to remove surface features from the copper that could have caused problems with $B_0$ homogeneity, especially considering the close proximity to the sample. Stages of different micropolish solutions from Buehler were used. The surfaces were initially rinsed with distilled water and isopropanol. Then a Buehler 2⅞" Texmet 1000 polishing disc was dabbed with Metadi 9 µm diamond paste and soaked with Metadi solution. To preserve the edges of the microstrip, the wiping motion was confined to the axis of the microstrip. This motion was performed for about 2-5 minutes. The surface was washed in water and isopropanol and viewed under an optical microscope to observe the progress. This sequence was repeated several times until a consistent finish was seen. This overall process was then repeated with a 3 µm diamond paste followed by a 1 µm diamond paste. Since the grain size was now small compared to a feature size, polishing was done in a circular manner to get an isotropic finish. The final polish was a sub-micron colloidal silica (SiO2) solution. A felt-based Microcloth polishing disc was used with distilled water as the solution, and this process was applied 2-3 times (with optical microscope viewing) for about 5-10 minutes each.

Slotted Microstrip Nuclear Magnetic Resonance Probe

The slotted microstrip can be used to provide an improved probe for nuclear magnetic resonance detection. Probes are a vital component of NMR instrumentation. The probe holds the sample under study and applies radio frequency signals to each molecule. The probe then detects the electromagnet signals that the molecule returns to the instrument to allow the exact structure of the molecule and its function to be determined. With increasing interest in the structure of biochemical molecules such as proteins, NMR spectrometers are key enabling tools for drug discovery, DNA analysis, and human proteomic studies.

Figure 8:
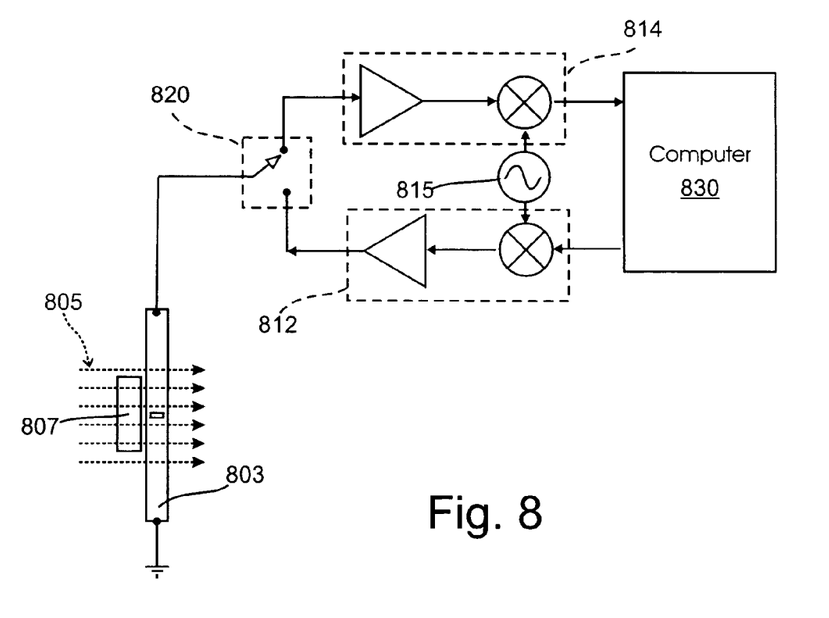
FIG. 8 is a schematic diagram of an NMR spectrometer employing a slotted microstrip.

The schematic for a typical NMR spectrometer is shown in FIG. 8 connected to a slotted microstrip at 803. A superconducting magnet (not shown) is required to apply a magnetic field 805 to cause an energy level splitting in the nuclear spins in a sample 807. This energy level splitting causes these nuclear spins to 'resonate' at a characteristic frequency called the Larmor frequency. In a conventional NMR spectrometer, the probe includes a coil that is placed around the sample to couple magnetic energy in and out of the system. In the arrangement shown in FIG. 8, the slotted microstrip 803 is used instead of a coil to apply and detect signals. A transmitter 812 translates an intermediate frequency (IF) from the oscillator 815 to the Larmor frequency. In the simplest case, pulses are applied to the slotted microstrip by gating a stable source oscillator 815, generating so-called 'hard pulses'. More complex instruments can be substituted that are able to generate arbitrary waveforms for more articulate types of spin control. In conventional NMR spectrometers, the same coil is used to detect the small NMR signal. In the arrangement of FIG. 8, the slotted microstrip 803 is used to both apply pulses at the Larmor frequency and to detect the resulting NMR signals from the sample. An analog super heterodyne receivers 814 is generally chosen based on the assumption that noise at different frequencies is uncorrelated. A high isolation switch 820 is needed to protect the low noise receiver 814 from the high power signals from the transmitter 812. Finally, a conventional computer acquisition system 830 samples the data, and basic signal processing techniques such as Fast Fourier Transforms and digital filtering are applied to simplify the analysis of the detected NMR signal received from the slotted microstrip 803.

The sample 807 may be a solution contained in tube positioned closely adjacent slotted microstrip transmitter/detector. For the 6.9 mm microslot, the sample was placed in a standard 5 mm Wilmad tube sealed with paraffin wax. For the 297 μm microslot, the sample was placed in 100 μm inner diameter (ID), 165 μm outer diameter (OD) microcapillary tubing from PolyMicro.

Results of Evaluations

The present invention has been shown to be a workable, easily fabricated, highly efficient electromagnetic filed sensor/generator that may be used to form new type of magnetic probe usable in NMR and other applications that can benefit from the use of a device that can scale from centimeters down to tens of nanometers. This microslot probe is based on planar waveguide microstrips shaped to exhibit boundary conditions that achieve flux concentration.

The microslot has been demonstrated to be the highest sensitivity planar detector known. For sucrose, the device provided a measured sensitivity of 984/μmol/pHz, high RF homogeneity (A270/A90>0.97) at RF frequencies due to current bunching on the sides of the conductor, and the ability to work at high NMR frequencies (500 MHz) with a circuit model that agrees strongly with network measurements.

The microslot can be readily fabricated with very simple manufacturing techniques. The general structure was made using chemical etching and the small slot in the microstrip was made using an excimer laser micromachining center. Conventional microfabrication techniques could be used to make microslots in the future, and the slotted microstrip should be easily fabricated even to scales less than 1 μm, in contrast to microcoils which have only been made with an inner diameter of 75 μm via hand winding.

A microslot probe was constructed at 297 μm and 6.9 mm, and computer modeling was done between 60 μm and 1200 μm, and a 1/r relationship was found. The field strength from the two fabricated probes fit on this 1/r curve, indicating that the same performance curves provided by microcoils can also be obtained with microslots, while providing the added ability to scale the devices to very small sizes.

The microslot probe was used to do two-dimensional spectroscopy on approximately 1 nmol of a small peptide, or $10^{14}$ peptide molecules. Cross peaks were visible showing that at this small sample size, microslots can be used to elucidate protein and peptide structure. This is the first time that peptide measurement has been demonstrated using a planar probe with a volume of material this small.

Improvements and Modifications

The present invention provides a new inductive method for measuring spins using NMR. In its nascent stage, it has demonstrated the highest sensitivity of any planar probe and promises to improve sensitivity with decreasing scale. Still, there are many ways the microslot could be improved (beyond simply scaling it smaller):

Spectral tails. As was shown by NMR experiments with water, the shape of the spectrum was non-Lorentzian and over ½ of the integrated signal was in the tails. It is believed that susceptibility matching of the probe could improve the sensitivity by close to a factor of 2. A uniform coating of polyethylene on the surface of the probe is a promising approach. The best option is to susceptibility match the copper with a metal such as palladium to the correct thickness. (The deposition of palladium must be electroplated rather than sputtered, due to argon contamination).

Decreasing resistance. The geometry of the microslot circuit board is the first of its kind and was not optimized for maximizing inductance and lowering resistance. These issues raise the general question of how to create boundary conditions given the constraints of a fixed surface area. Thickening the copper should provide improvements, as the conduction pathways for current will increase. Ideally, for structures above and below the skin depth regime, the cross-section of the conductor should be as tall as it is wide, which is more feasible as the structure size decreases.

Microfluidics. Improved sample handling may be achieved by integrating microfluidics with the slotted microstrip. The planar and simple geometry of slotted microstrip structure makes it highly amenable to microfluidic integration. Namely, the slot itself could serve as a port for microfluidic integration. A sample cavity could be etched into the dielectric, or a cavity could be sandwiched on the top of the copper surface. One of the issues facing microslots and other microprobe technology is sample access for picoliter to nanoliter volumes. Capillary tubes don't scale much further than the 75-300 μm range currently being tested because the capillary wall thickness versus sample volume ratio must increase in order to maintain mechanical strength. Ideally, the homogeneity of the microslot may be improved by palladium plating or other techniques, allowing the sample could be placed directly on the surface of the probe, further improving both homogeneity and sensitivity. Microfluidics may be applied to particular advantage in CIDNP protein work, in which the protein and flavin sensitizer could be reflowed once the sensitizer is consumed.

Fabrication Scaling

The current limit of detection for the 297 μm probe is approximately 3 nmol/pHz. Based on the 1/r scaling curve shown FIG. 6, the highest sensitivity detector crosses the SNR limit of 0 dB in 1s. This sensitivity comes from a 10 μm wide microslot, where the Limit Of Detection (LOD) is 100 pmol/pHz. Based on the scaling of the sensitivity for sucrose, this will correspond to about $2.9 \times 10^4$/μmolpHz, much higher than any published result for sucrose. The fabrication of a 10 μm wide microslot should be relatively easy using conventional microfabrication techniques.

Future NMR Applications

There are a number of potentially interesting uses for microslots in the field of NMR:

Cell/neuron spectroscopy. Because the microslot probe is planar and has high sensitivity, it could be a platform for detecting molecular transport in cells/neurons. (With microcoils, sample access for these biological samples would be very difficult).

Solid-state NMR. Sample spin speed has a tremendous effect on solid line width. With a small sample and a microslot, one may be able to spin samples at much higher frequencies. Such an innovation could lead to a new type of MEMS solid-state NMR.

TOCSY and QI. Both TOtal COrellation SpectroscopY (TOCSY) transfers [see John Cavanaugh, G. Arthur Palmer III, Wayne Fairbrother, and Nick Skelton. *Protein NMR Spectroscopy: Principles and Practice*. Academic Press, New York, 1996.] and Quantum Information (QI) gates [see Michael A. Neilsen and Isaac L. Chuang. *Quantum Computation and Quantum Information*. Cambridge University Press, Cambridge, UK, 2000] can be implemented with smaller error from shorter pulse widths for a π/2 pulse. Given that B/i is 10-30 times higher for a microslot probe than for a conventional probe or cooled probe, enormous benefits could be gained.

Microimaging. For microimaging of cells and other microscopic objects, a microslot could pose an enormous benefit for an imaging setup as the field gradients and spin probe could be made on a single substrate with high sensitivity.

HPLC-NMR. High Performance Liquid Chromatography (HPLC) has had enormous impact in chemistry labs in which on-line spectroscopy during separations is used. integrating a microfluidic system with a microslot doing HPLC could be of great benefit for chip-scale chemical laboratories.

Parallel acquisition. Giving the ease of fabrication of a microslot probe and its planar geometry, it has great potential for any problem that involves inspecting samples in parallel or HPLC separations. Microslot probes also have the ability to do continuous NMR acquisition—while spins are relaxing in one sample tube, useful data could be collected using additional probes.

Small molecule combinatorial chemistry. Combinatorial chemistry [see K. C. Nicolaou, Rudolf Hanko, and Wolfgang Hartwig. *Handbook of Combinatorial Chemistry: Drugs, Catalysts, Materials*. Wiley-VCH, New York, 2002] relies on mass spectroscopy for creating a feedback process to select chemical pathways. With the much higher sensitivity and applicability to large-scale parallelism that microslots can provide, NMR, with its ability to do detection in the liquid phase, could have much greater impact.

Table NMR. A holy grail for NMR is to do high resolution spectroscopy on a table-top system so that entire rooms of expensive electronics and magnets could be replaced by a small and inexpensive table-top system. Since the sample volume required by microslots is much smaller than that required by conventional NMR, microslots could have high homogeneity from much more inhomogeneously broadened magnets than superconducting magnets. This may allow simple magnetic loop circuits that generally obtain part per thousand homogeneity over a 5 mm tube to have part per million or billion homogeneity over a 10-100 μm sample diameter.

Other Applications

There are a range of non-NMR applications based on the simple design and ease of fabrication of microslots:

Micromanipulation or heating of nanoparticles. Work by Hamad et al. [see Kimberly Hamad-Schifferli, John J. Schwartz, Aaron T. Santos, Shuguang Zhang, and Joseph M. Jacobson. Remote electronic control of dna hydribidization through inductive coupling to an attached metal nanocrystal antenna. *Nature*, 415:152-155, 2002] has been useful for reversibly manipulating DNA and other biomolecules. Microslots could be used to make very local stimulators for precise drug delivery or on "lab on a chip" type scenarios. A rapidly varying and strong magnetic field could also be used to make ratchet motors using thermal motion of a magnetic particle.

Electromagnetic imaging. One immediate application of a microslot could be as a non-contact detector of the electromagnetic fields produced by powered integrated circuits. There is a burgeoning field of scanning microwave spectroscopy using the tip of a coaxial cable [see C. P. Vlahacos, R. C. Black, S. M. Anlage, A. Amar, and F. C. Wellstood. Near-field scanning microwave microscope with 100 μm resolution. *Applied Physics Letters*, 69:3272-3274, 1996], a small hole in a waveguide, a microstrip resonator [see U.S. Pat. No. 6,692,426 issued to Xiang et al. (Internatix Corp.), the disclosure of which is incorporated herein by reference, and Massood Tabib-Azar, Neil S. Shoemaker, and Stephen Harris. Nondestructive characterization of materials by evanescent microwaves. *Measurement Science Technology*, 4:583-590, 1993], or conventional SFM [see D. W. van der Weide. Localized picosecond resolution with a near-field microwave/scanning-force microscope. *Applied Physics Letters*, 70(6):677-679, 1997], to scanning surfaces. It has been shown both for microwaves and optical wavelengths that by geometric boundary conditions, evanescent waves can obtain resolution much smaller than the diffraction limit. These techniques have been used to monitor individual digital lines using an EFM [see J. W. Hong, Z. G. Khim, A. S. Hou, and Sang il Park. Noninvasive probing of high frequency signal in integrated circuits using electrostatic force microscope. *Review of Scientific Instruments*, 68:4506-4510, 1997] and image passive structures as small as 8 μm using a dipole pattern on the tip of an STM [V. Agrawal, P. Neuzil, and D. W. van der Weide. A microfabricated tip for simultaneous acquisition of sample topography and high-frequency magnetic field. *Applied Physics Letters*, 71(16):2343-2345, 1997]. A microstrip structure could be used to scan the electromagnetic signature of a running integrated circuit to learn about good and bad design, characterize faulty chips, and potentially replace expensive probe scanners.

Parasitic electronics. Simple metal structures may be used as detectors of electric or magnetic fields within integrated circuits and circuit board designs. Conventional circuits generally operate in the basis of {V,I}, but could be extended to {E,B} in the RF regime since any voltage or current in a circuit will produce a field that can be measured, and if the detector is small, then the impedance load of the detector can also be small (parasitic). As an example, parasitic electronics could potentially be useful for power amplifier designs that use feedback from the measured E field from a chip to confirm that the power output is stable. Calibration could then be based on geometry and laser-trimmed in the factory for proper power settings.

Figure 9:
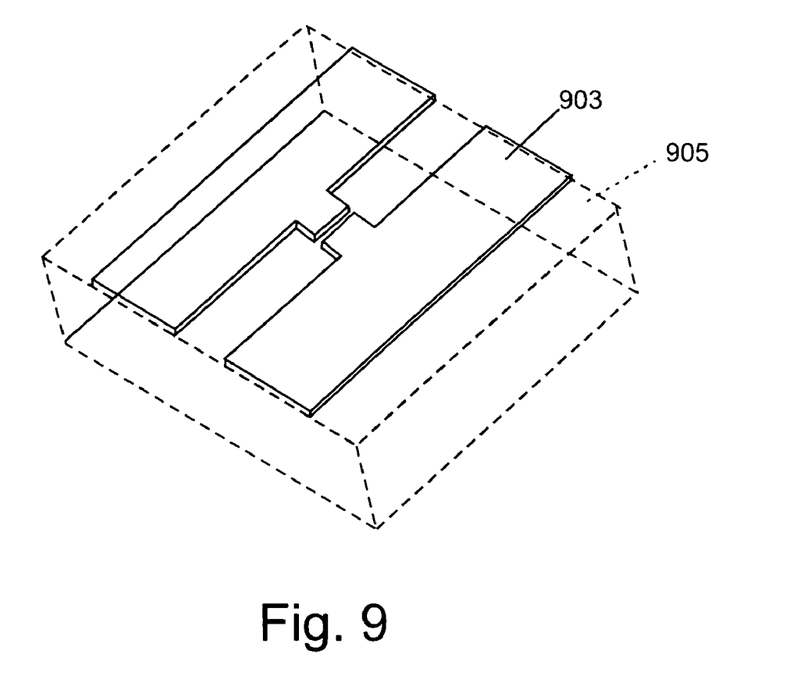
FIG. 9 depicts a slotline on a dielectric with symmetric protrusions crealing a concentrated electric field at their interface.

High speed capacitive interconnect buses. IBM designs for the Blue Gene supercomputer used capacitive interconnects for high speed parallel data buses [see F. Allen et al. Blue Gene: A vision for protein science using a petaflop computer. *IBM Systems Journal*, 40(2):310-327, 2001]. FIG. 9 shows a slotline 903 on a dielectric 905 with symmetric protrusions creating a concentrated electric field at their interface with no magnetic component in the middle. This is a capacitive cor-

CONCLUSION

It is to be understood that the methods and apparatus which have been described above are merely illustrative applications of the principles of the invention. Numerous modifications may be made by those skilled in the are without departing from the true spirit and scope of the invention.

What is claimed is:

1. An electromagnetic field detector comprising, in combination,
    a conductive ground plane,
    an elongated conductor extending in a plane parallel to and spaced from said ground plane, said elongated conductor having a long dimension and a width dimension perpendicular to said long dimension, said width dimension being less than 1 cm and being substantially constant along at least a portion of said long dimension except at a sensing location at which a discontinuity defined in said elongated conductor significantly alters said width dimension at said sensing location,
    and an electrical sensing circuit coupled to said elongated conductor for detecting highly localized high-frequency near field electromagnetic radiation in the immediate vicinity of said sensing location, said elongated conductor and said discontinuity being non-resonant at the frequency of said high frequency signal.

2. An electromagnetic field detector as set forth in claim 1 wherein said elongated conductor is separated from said conductive ground plane by a dielectric material which supports said elongated conductor.

3. An electromagnetic field detector as set forth in claim 2 wherein said elongated conductor is a flat strip.

4. An electromagnetic field detector as set forth in claim 3 wherein said conductive ground plane has an effective surface area that is large in comparison to the width of said flat strip.

5. An electromagnetic field detector as set forth in claim 2 wherein said dielectric material has a dielectric constant more than two times that of free space.

6. An electromagnetic field detector as set forth in claim 1 wherein said near field electromagnetic radiation is produced by a physical sample or object positioned closely adjacent to said sensing location.

7. An electromagnetic field detector as set forth in claim 6 wherein said physical sample or object is selected from group comprising a biomolecule, a small sample of biological material, a portion of a semiconductor circuit being analyzed, or a memory element whose state may determined or altered by said electromagnetic field.

8. An electromagnetic field detector as set forth in claim 6 wherein said physical sample or object is a biomolecule or a small sample of biological material.

9. An electromagnetic field detector as set forth in claim 6 wherein said physical sample or object is a portion of an operating semiconductor circuit which produces said near field electromagnetic radiation.

10. An electromagnetic field detector as set forth in claim 1 wherein said near field electromagnetic radiation is produced by the nuclear magnetic resonance of a material positioned at or near said sensing location.

11. An electromagnetic field sensor comprising, in combination,
    a radio frequency transmission channel consisting of a microstrip conductor spaced from and parallel to a ground plane conductor, said microstrip conductor and said ground plane conductor being separated by a low-loss dielectric material, said microstrip conductor having a long dimension and a width dimension of less than 1 cm,
    a discontinuity in said microstrip conductor which substantially alters said width dimension of said microstrip conductor at a sensing location to cause electrical signals to be induced in said microstrip conductor by highly localized high-frequency near field electromagnetic radiation produced by a physical object in the immediate vicinity said sensing location, said radio frequency transmission channel and said discontinuity being non-resonant at the frequency of said electromagnetic radiation, and
    an electrical signal sensor coupled to said radio frequency transmission channel for detecting said electrical signals.

12. An electromagnetic field sensor as set forth in claim 11 wherein said electrical signal sensor is a nuclear magnetic resonance sensor wherein said electromagnetic field is produced by the precession of the transverse magnetization of the spins of nuclei of atoms in said physical object.

13. An electromagnetic field generator comprising, in combination,
    a high frequency transmission channel consisting of an elongated microstrip conductor spaced from and parallel to a ground plane conductor, said microstrip conductor and said ground plane conductor being separated by a low-loss dielectric material, said microstrip conductor having a long dimension and a width dimension of less than 1 cm,
    means for applying a high frequency electrical signal to said microstrip conductor,
    a perturbation in the shape of microstrip conductor that causes highly localized near field electromagnetic radiation to be produced in the immediate vicinity of said perturbation due to said high frequency signal, said microstrip conductor and said perturbation being non-resonant at the frequency of said electromagnetic radiation,
    an electromagnetically responsive object or material positioned to receive said near field electromagnetic radiation.

14. An electromagnetic field generator as set forth in claim 13 wherein said electromagnetically responsive object or material exhibits nuclear magnetic resonance.

15. An electromagnetic field generator as set forth in claim 13 wherein said electromagnetically responsive material is a magnetic memory element whose state of magnetization may be set by said near field electromagnetic radiation.

16. A method for producing a highly localized electromagnetic field comprising the steps of:
    forming an elongated conductive member having a long dimension and a substantially constant width of less than 1 cm perpendicular to said long dimension except at a discontinuity where the effective width of said conductive member is substantially different from said constant width, and
    applying a high frequency electrical excitation signal to induce a current flow along said long dimension of said conductive member and inducing a highly localized near field electromagnetic field in the immediate vicinity of said discontinuity, said conductive member having width and thickness dimensions that are substantially smaller that the wavelength of said high frequency excitation signal so that said conductive member and said discontinuity are both non-resonant at the frequency of said high frequency excitation signal.

17. A method for producing a highly localized electromagnetic field as set forth in claim 16 wherein said discontinuity is formed by removing a portion of said conductive member.

18. A method for producing a highly localized electromagnetic field as set forth in claim 17 wherein said discontinuity is formed by an aperture cut into said conductive member.

19. A method for producing a highly localized electromagnetic field as set forth in claim 17 wherein said discontinuity is formed by a slot cut into one side of said conductive member.

20. A method for producing a highly localized electromagnetic field as set forth in claim 17 wherein said discontinuity is formed by slots cut into opposing sides of said conductive member.

* * * * *